United States Patent [19]
Cotroneo

[11] Patent Number: 5,495,167
[45] Date of Patent: Feb. 27, 1996

[54] ELECTRICAL ENERGY METER HAVING RECORD OF METER CALIBRATION DATA THEREIN AND METHOD OF RECORDING CALIBRATION DATA

[75] Inventor: Anthony S. Cotroneo, Rochester, N.H.

[73] Assignee: General Electric Company, New York, N.Y.

[21] Appl. No.: 273,860

[22] Filed: Jul. 12, 1994

[51] Int. Cl.$^6$ .................................................... G01R 35/04
[52] U.S. Cl. ........................................ 324/74; 364/571.02
[58] Field of Search ............................. 324/74, 116, 130, 324/142; 364/571.02, 571.05

[56] References Cited

U.S. PATENT DOCUMENTS

| | | |
|---|---|---|
| 3,896,488 | 7/1975 | Carney et al. . |
| 4,120,031 | 10/1978 | Kincheloe et al. . |
| 4,133,034 | 1/1979 | Etter . |
| 4,166,975 | 9/1979 | Germer et al. ..................... 324/116 |
| 4,224,671 | 9/1980 | Sugiyama et al. . |
| 4,240,149 | 12/1980 | Fletcher et al. . |
| 4,271,390 | 6/1981 | Canu . |
| 4,283,772 | 8/1981 | Johnston . |
| 4,361,872 | 11/1982 | Spalti . |
| 4,439,764 | 3/1984 | York et al. . |
| 4,542,469 | 9/1985 | Brandyberry et al. . |
| 4,598,248 | 7/1986 | Germer . |
| 4,608,560 | 8/1986 | Allgood . |
| 4,646,003 | 2/1987 | Phillips et al. . |
| 4,646,084 | 2/1987 | Burrowes et al. . |
| 4,659,985 | 4/1987 | Bianchi . |
| 4,692,874 | 9/1987 | Mihara . |
| 4,804,957 | 2/1989 | Selph et al. . |

(List continued on next page.)

OTHER PUBLICATIONS

General Electric's *Manual of Demand Meters* (undated).
General Electric's *Manual of Watthour Meters* (Apr. 1980).
General Electric's Technical Reference Manual entitled *Phase3i™ Electronic Meter* (Feb. 1993).
General Electric brochure entitled *The General Electric Universal Reader (1987)*.
General Electric brochure entitled *Today's Most Advanced Electronic Metering System* (Dec. 1986).
General Electric brochure entitled *The TM–91 Tou Self-Reading Register* (Dec. 1985).
General Electric brochure entitled *Expanding the Limits of Interval Demand Recording* (1988).
General Electric brochure for GE UCNet System entitled UCNet™ Puts You In Touch With Your Customers (Sep. 1991).
General Electric brochure for GE Phase 3 Meter entitled *The Phase3 Electronic Polyphase Meter–A New World of Possibilities* (Feb. 1991).
GE Meter and Control, *Type M–90AE™ Demand Register on Type EV/ES Meter Platform*, GEH–5069, Aug. 1992.

*Primary Examiner*—Ernest F. Karlsen
*Assistant Examiner*—Russell M. Kobert
*Attorney, Agent, or Firm*—Bell, Seltzer, Park & Gibson

[57] ABSTRACT

An electrical energy metering system includes a solid-state electrical energy meter with non-volatile factory calibration memory and non-volatile field calibration memory therein. The system also includes a programming unit, such as a hand-held computer, for programming the factory calibration memory with factory calibration parameters and for programming the field calibration memory with field calibration parameters obtained from field testing of the meter. The calibration parameters includes parameters relating to meter measurement accuracy such as full-load, light-load and lag calibration parameters. These parameters can be generated during periodic field tests and stored in the meter for retrieval at a later date, such as during a subsequent test of the meter. Because the meter is capable of retaining a plurality of calibration parameters from each field test, a chronological history of data relevant to meter accuracy can be stored in the meter and a paperless transfer of this data to a utility database can be achieved.

17 Claims, 4 Drawing Sheets

U.S. PATENT DOCUMENTS

| | | | |
|---|---|---|---|
| 4,837,504 | 6/1989 | Baer et al. | 324/74 |
| 4,881,070 | 11/1989 | Burrowes et al. . | |
| 4,884,021 | 11/1989 | Hammond et al. | 324/116 |
| 4,912,397 | 3/1990 | Gale et al. | 324/132 |
| 4,933,633 | 6/1990 | Allgood . | |
| 5,017,860 | 5/1991 | Germer et al. . | |
| 5,066,906 | 11/1991 | Moore . | |
| 5,214,587 | 5/1993 | Green . | |
| 5,231,347 | 7/1993 | Voisine et al. . | |
| 5,245,275 | 9/1993 | Germer et al. | 324/74 |
| 5,248,935 | 9/1993 | Sakoyama et al. . | |
| 5,270,639 | 12/1993 | Moore . | |
| 5,270,958 | 12/1993 | Dastous | 364/569 |
| 5,336,991 | 8/1994 | Atherton et al. | 324/142 |

ELECTRICAL ENERGY METER HAVING RECORD OF METER CALIBRATION DATA THEREIN AND METHOD OF RECORDING CALIBRATION DATA

FIELD OF THE INVENTION

The present invention relates to electrical energy metering systems and methods of testing electrical energy meters.

BACKGROUND OF THE INVENTION

Electrical energy utilities are frequently required by state or local regulations or by energy customers to verify the accuracy of electrical energy meters operating in the field. To satisfy these requirements, utilities typically incur the expense of initially testing the accuracy of each meter (or a statistically significant number of meters) upon receipt from a manufacturer. Once in service, utilities again incur the expense of testing the accuracy of each meter to verify its continued accuracy from the date of installation. Thus, utilities periodically send skilled meter testpersons to meter sites, particularly those of large energy customers, to perform in-service measurements of the accuracy of meters and perform calibration adjustments, if necessary. Examples of known meter testing devices are described in U.S. Pat. Nos. 4,271,390 to Canu and 4,646,003 to Phillips et el. On occasion, however, meters may need to be removed from the field to be calibrated and this can result in significant additional expense to utilities. All of these expenses are ultimately reflected in higher energy rates for the consumer.

To provide energy at economical rates and maintain quality control over billing operations, utilities typically develop in-house computer databases covering the maintenance histories of all meters in service. Such databases can include information cataloged by meter serial number and/or manufacture or customer name, etc. These maintenance histories can then be used as a form of feedback to utilities and meter manufacturers to ensure accurate energy measurement. However, establishment and maintenance of these databases requires additional computer hardware, software and database personnel which can be expensive.

Accordingly, to improve quality control and provide energy at the lowest possible rates, utilities have begun to demand that meter manufacturers not only provide meters with a high degree of accuracy, but also provide meters that can be easily tested and calibrated. Utilities have also begun to request additional information relative to the specific accuracy of each meter prior to shipment. Manufacturers presently provide this information in media such as printouts or floppy disks; however, this information often needs to be converted to a format which is compatible with the utilities' database and/or re-keyed into the database. This process can be time consuming and expensive.

Thus, notwithstanding these attempts to ensure meter accuracy and maintain accurate billing operations, there still exists a need to provide a more efficient and economical database of meter information and means of verifying meter accuracy.

SUMMARY OF THE INVENTION

It is therefore an object of the present invention to provide an electrical energy metering system having an efficient and economical database for maintaining meter calibration data.

It is another object of the present invention to provide an efficient method of recording meter calibration data.

It is a further object of the present invention to provide an electrical energy meter system for facilitating the automated and paperless transfer of meter calibration data from a meter to an external database.

These and other objects and advantages of the invention are provided by an electrical energy metering system having an electrical energy meter, non-volatile factory calibration memory in the meter, non-volatile field calibration memory in the meter and means, responsive to user actuation, for programming the non-volatile factory calibration memory and the field calibration memory with calibration parameters. The meter also preferably includes a protective meter housing, and metering means, register means and display means in the housing.

The calibration parameters typically include full-load, light-load and lag calibration parameters. These parameters are periodically generated and monitored over the life of a meter so that a utility can maintain quality control over its billing operations, by reducing the likelihood that an energy customer will be under- or over-billed because of an inaccurate meter. These parameters can be generated at the factory and during periodic in-service (or meter-shop) testing of the meter under full-load and light-load conditions. The full-load and light-load test conditions are typically based on the particular rating of the meter.

In particular, the non-volatile field calibration memory functions as a built-in or "personal" database of meter calibration parameters and other data for each respective meter. Corresponding calendar dates and times for each of the field tests can also be maintained at adjacent addresses of the field calibration memory so that a chronological history of meter accuracy can be readily downloaded and displayed in the field by the meter's display means, displayed on a separate hand-held computer or displayed on a utility computer system.

The chronological history of meter accuracy is preferably achieved by measuring the operational accuracy of the meter at a first calendar date at respective full- and light-load levels to obtain first calibration parameters and then storing the first calibration parameters in the field calibration memory. These steps are then repeated at second and subsequent calendar dates over the life of the meter. Measuring the operational accuracy of the meter at the first calendar date under either full- or light-load levels typically involves testing the meter with a first predetermined energy quantity (e.g., 500 VAhours) to obtain a measurement of the first quantity (e.g., 500±$\epsilon$ VAhours) and then generating a first calibration parameter based on a difference ($\epsilon$) between the first energy quantity and the measurement of the first energy quantity. The first calibration parameter can be expressed as a percentage (e.g., ±1% or ±0.01) or ratio (e.g., 0.990 or 1.01) or other mathematically equivalent form.

According to a first embodiment of the present invention, programming means is provided by a portable computer which can be operatively connected to the meter's register means by interfacing means such as a serial data link. A communications port is also preferably provided at a face of the meter housing and interfacing means is operatively connected between the port and register means. In this embodiment, programming means is used to communicate with the meter and periodically program the field calibration memory therein with the calibration parameters, based on in-service testing of the meter in the field. Programming means also preferably include means for reading the calibration parameters from the meter's factory calibration memory and field calibration memory and means for displaying these parameters such as by displaying a trend or change in operational accuracy of the meter as a function of time, etc.

According to a second embodiment of the present invention, the above-described programming means is provided in the meter. In this embodiment, an application specific integrated circuit (ASIC) is provided for performing the functions of the register means and programming means. Programming means also preferably includes a keypad, at a face of the meter (or meter housing). The keypad is electrically connected to the application specific integrated circuit.

Accordingly, the first and second embodiments of the present invention include means for metering a quantity of electrical energy delivered to a load; register means for recording the quantity and performing other meter functions; means for displaying the quantity; non-volatile factory calibration memory; and non-volatile field calibration memory. Display means for the first and second embodiments may include an alphanumeric display on a portable computer or a face of the meter, respectively.

DESCRIPTION OF THE PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
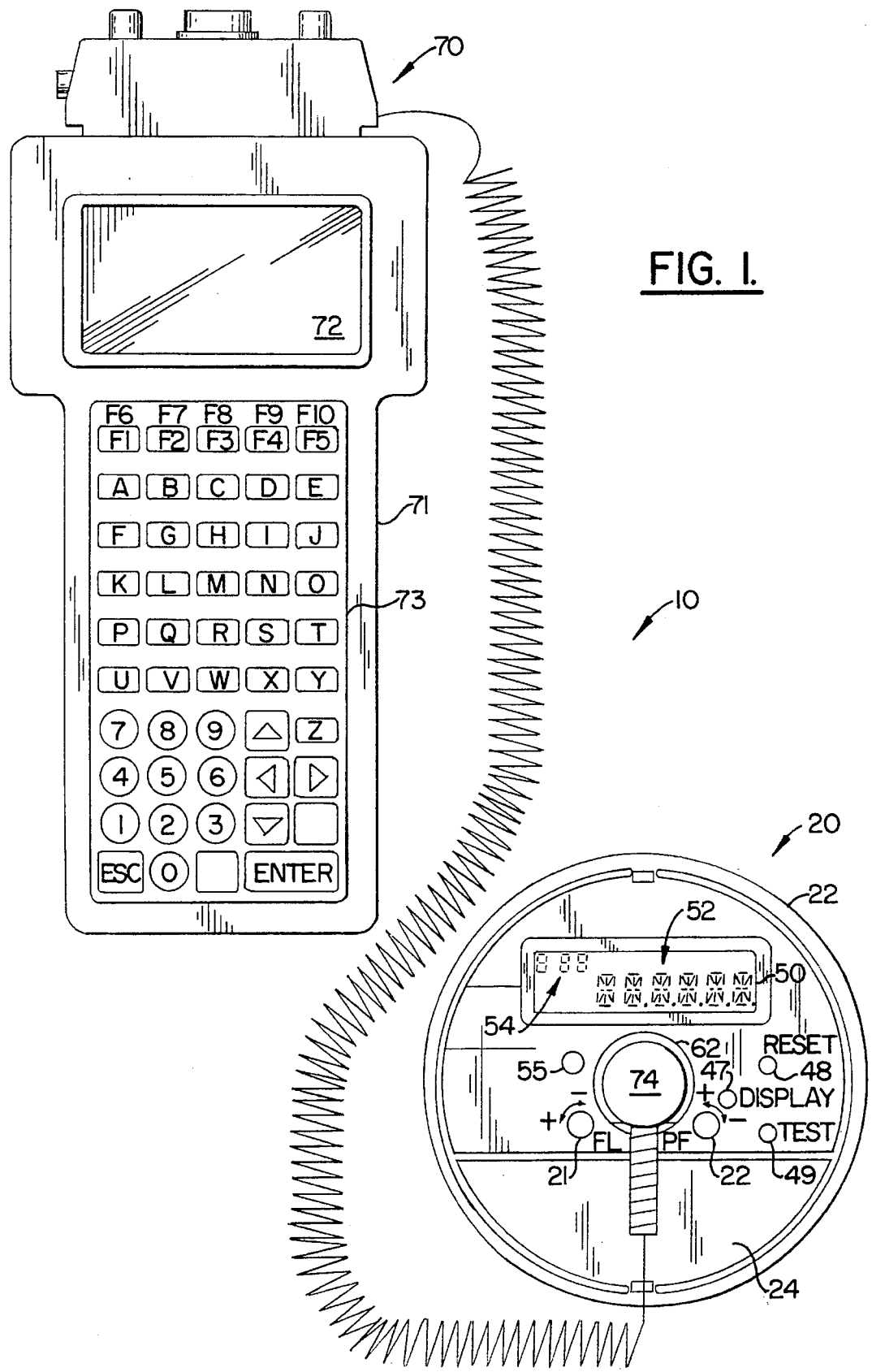
FIG. 1 is a front perspective view of an electrical energy metering system according to a first embodiment of the present invention.
Figure 2:
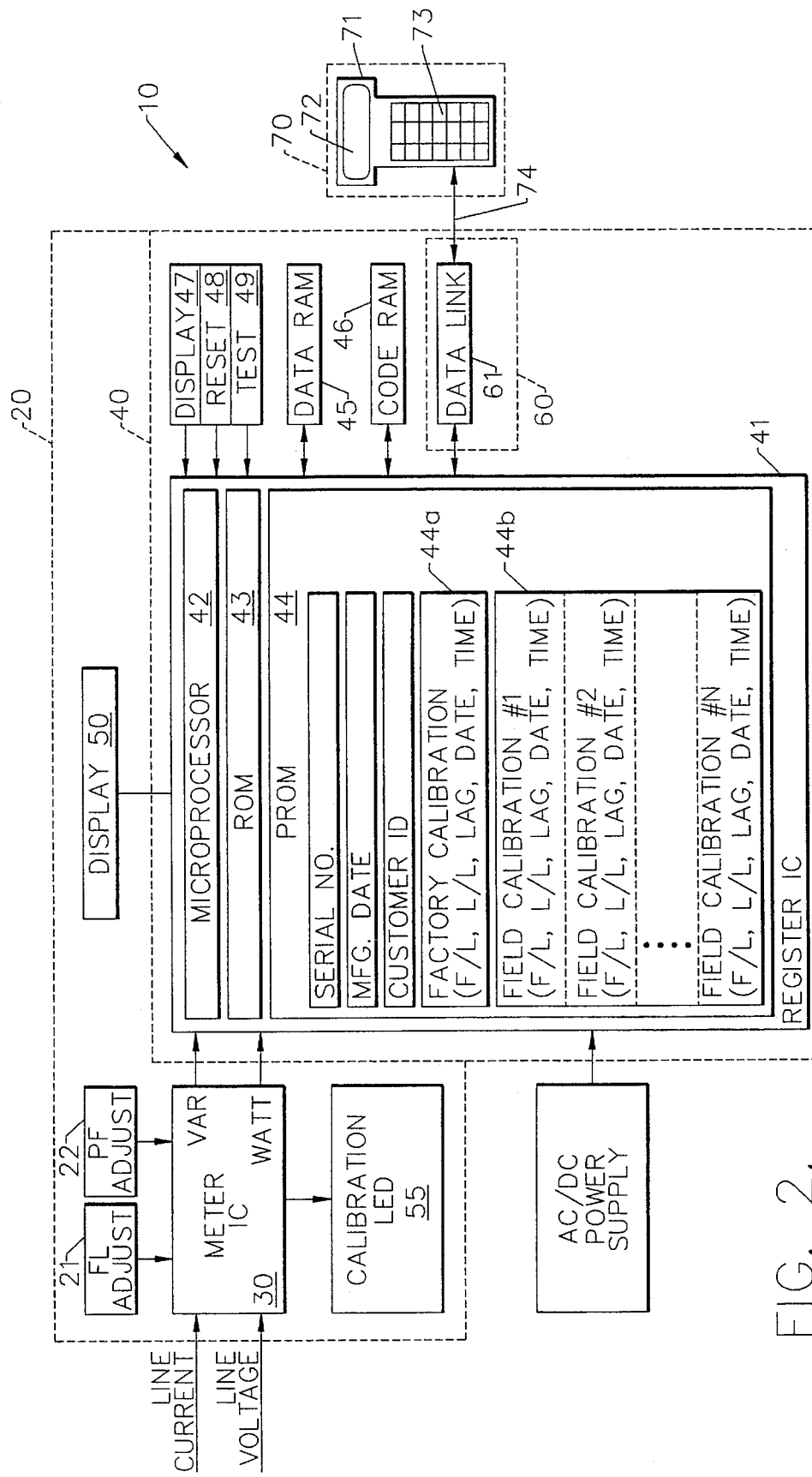
FIG. 2 is an electrical schematic representation of the metering system of FIG. 1.

Referring now to FIGS. 1–2, an electrical energy metering system according to a first embodiment of the present invention is illustrated. The metering system 10 includes an electrical energy meter 20 having a protective housing 22 (e.g. glass) and means 30 therein for metering a quantity of electrical energy consumed by a load. Register means 40, which is electrically connected to the metering means 30, is also provided for recording the quantity and display means 50 is included for displaying the quantity. According to a preferred embodiment of the present invention, metering means 30 is preferably an electronic circuit embodied in one or more integrated circuits and/or other electrical components. Metering means 30 has inputs for sensing a line current and line voltage from a power line (not shown) and outputs for providing watthour and varhour pulse trains (WATT, VAR) and providing other necessary signals (not shown) to register means 40. Display means 50 preferably comprises a multi-segment liquid crystal alphanumeric display (LCD) at a face 24 of the meter 20, as illustrated. The liquid crystal display 50 can include a six character alphanumeric field 52, three digit numeric field 54, and annunciator segments and pulse and direction indicators (not shown).

Register means 40 is preferably solid-state and includes a register integrated circuit 42 such as an application specific integrated circuit (ASIC). Register means 40 also preferably includes data random-access memory 45 and code random-access memory 46 (RAM) for data storage and program memory, respectively. Display, reset and test switches 47–49, are also provided at the face 24 of the meter, as illustrated. The reset switch 48 may be actuated to reset the meter 20 and allow conversion of the meter from a demand-only mode of operation to a time-of-use and demand mode of operation, for example. A test mode of operation may also be initialized so that calibration testing of the meter 20 can occur. The test mode is activated by pressing the test switch 49. During test mode operation, register means 40 transfers all billing data to memory for later retrieval after calibration testing has been completed. Test data which is accumulated in the test mode will not be added to the billing data. The display switch 47 can also be pressed repeatedly to sequence or scroll through alternative displays for the alternative modes of operation and test, etc.

As will be understood by those skilled in the art, the ASIC 41 includes integrated circuits for performing microprocessor control functions, display control functions, A/D conversion functions, non-volatile memory functions, etc. As illustrated, the ASIC 41 can include a microprocessor portion 42, a read-only memory (ROM) portion 43 and a programmable read-only memory (PROM) portion 44.

In particular, factory calibration memory 44a is provided in PROM 44 for retaining a plurality of factory-installed calibration parameters such as light-load (L/L), full-load (F/L) and lag calibration parameters. Data corresponding to meter serial number, manufacture date and customer ID may also be included therein. Field calibration memory 44b is also provided in PROM 44 for retaining a plurality of field-programmed calibration parameters. Field-programmed calibration parameters also typically include light-load, full-load and lag calibration parameters. The size of the field calibration memory 44b is preferably chosen to account for a lifetime of periodic field or meter-shop calibration testing of the meter to verify its accuracy. As illustrated, PROM 44 is preferably formatted so that calibration parameters which are generated during consecutive field tests can be retained at adjacent memory addresses along with the corresponding test dates and time. The non-volatile field calibration memory 44b functions as a built-in or "personal" database of meter calibration parameters, test dates and other pertinent data which can be used to construct a chronological history of meter accuracy over the life of a meter.

Programming means 70, responsive to user actuation, is also provided for programming a first portion of the field calibration memory 44b with a first calibration parameter(s) (e.g., L/L, F/L, lag) and for programming a second portion of the field calibration memory 44b with a second calibration parameter(s). According to the first embodiment of the present invention, programming means 70 may include a portable (e.g hand-held) computer 71 having a display 72, a keypad 73 for entering data into the meter 20 and optical/electrical data probe 74. Programming means 70 is operatively connected to the ASIC 41 by interfacing means 60 which may include a serial data link 61 or may include an RF transceiver for transmitting and receiving radio-frequency signals to and from a remote source. Interfacing means 60 may also include a transceiver for transmitting and receiving informational carrier signals to and from the power line.

A preferred serial data link is an optical "OPTOCOM™" link, marketed by General Electric Company, Meter Division, Somersworth, N.H., although other serial data links such as a modulator/demodulator "modem" (connected to a telephone line or coaxial cable) may also be used. A communications port 62, such as an optical communications port, can also be provided at a face of the meter housing 22. Thus, interfacing means 60 is connected between the port 62 and the ASIC 41. Programming means 70 is used to communicate with the meter 20 and periodically program the field calibration memory 44b therein with updated parameters, based on in-service field or meter-shop testing of the meter. Programming means 70 also preferably includes means for reading the calibration parameters from PROM 44 and displaying these parameters or other data derived therefrom (e.g., histograms, plots, statistical graphs, etc.) on the display 72. As will be understood by those skilled in the art, programming means 70 may include an application specific or general purpose microprocessor for performing the above-described functions.

Figure 3:
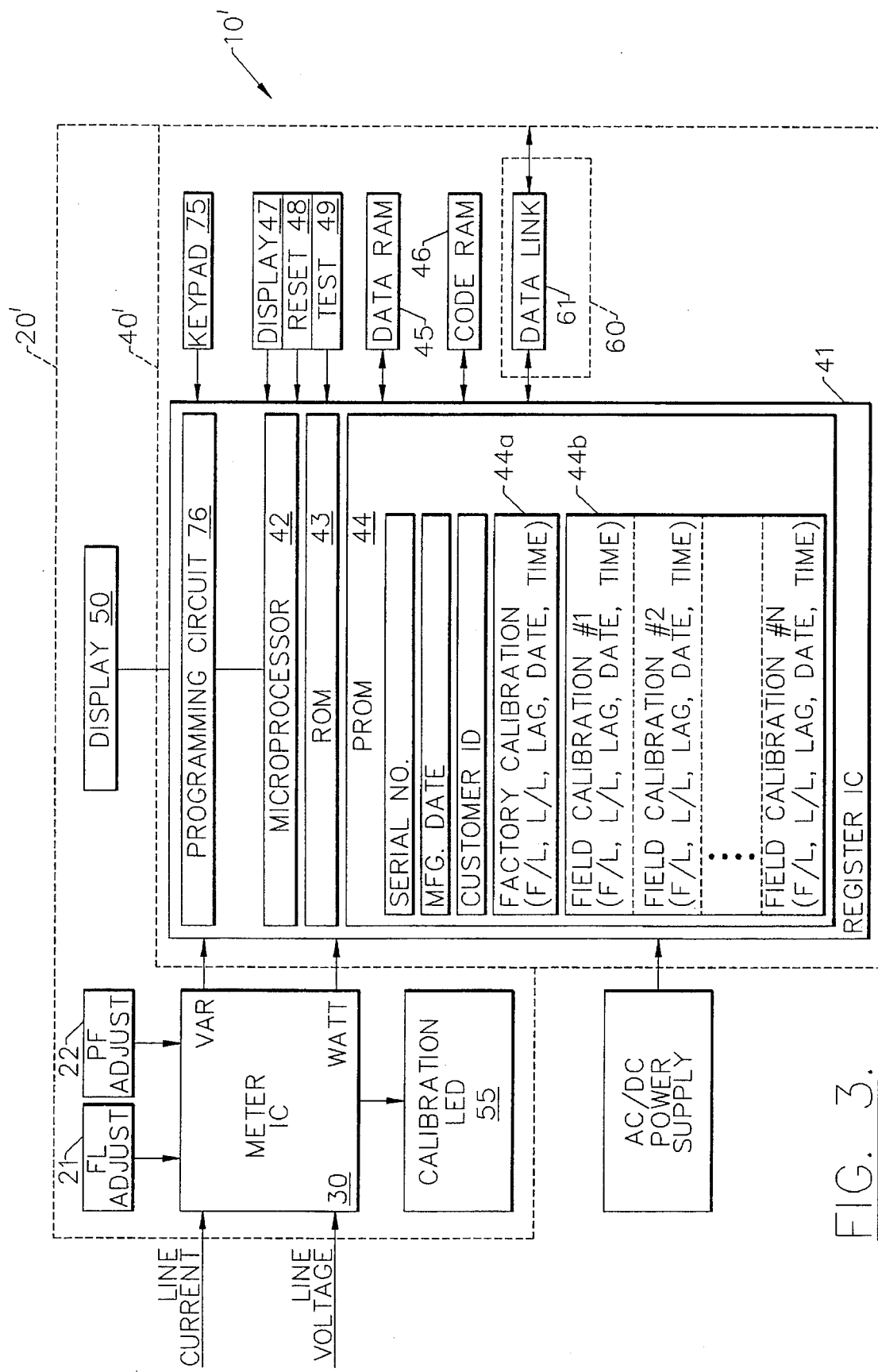
FIG. 3 is an electrical schematic representation of an electrical energy metering system according to a second embodiment of the present invention.

Referring now to FIG. 3, a second embodiment of the present invention will be described. The metering system 10' illustrated in FIG. 3 is similar to the system of FIG. 2, however, the meter 20' includes a programming circuit 76 in the ASIC 41 and a keypad 75 at the face 24 of the meter (or face of the housing 22), electrically connected to the ASIC 41. According to the second embodiment, the keypad 75 and the programming circuit 76 are designed to perform the functions of the portable hand-held computer 71 and the keypad 73 illustrated in FIG. 2. The display switch 47 may also be actuated to convert the normal display 50 to a display for illustrating calibration parameters and other related data.

Figure 4:
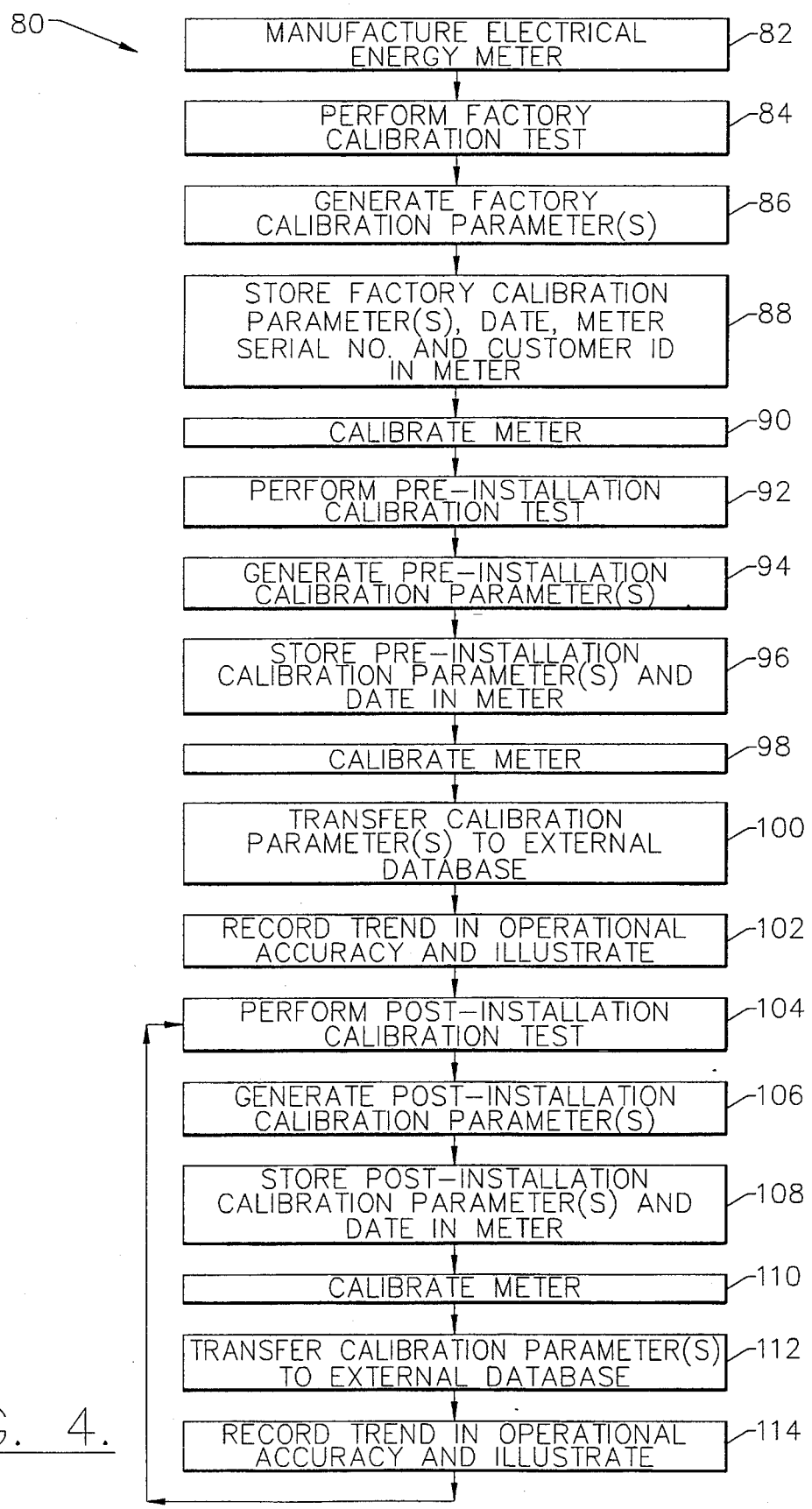
FIG. 4 is a flow-chart of steps corresponding to a preferred method of recording calibration data in an electrical energy meter.

Referring now to FIG. 4, the steps of recording calibration data in an electrical energy meter will be described. As illustrated, the electrical energy meter is manufactured, Block 82, and then a factory calibration test is performed to check the accuracy of the meter prior to shipping to a customer, Block 84. From the test, a plurality of factory calibration parameters are generated, Block 86, and then these parameters are stored in the meter's factory calibration memory 44a, Block 88. The corresponding date and time of the factory calibration test are also preferably stored in the meter along with the meter serial number and customer identification number or name which can be useful for tracking the meter in the field.

As illustrated by Blocks 84–86, a factory calibration test is initially performed by the manufacturer to check the accuracy of each meter. The calibration test typically involves measuring the operational accuracy of the meter against a predetermined energy quantity at both light- and full-load levels. These measurements can then be used to derive factory calibration parameters such as light-load, full-load and lag calibration parameters using techniques well known to those skilled in the art. For example, a calibrating infrared light-emitting diode (LED) 55 can be used to facilitate calibration testing of the meter. The LED emits invisible infrared pulses, each pulse representing a quantum of energy measured by the meter. The pulses can be detected by a suitable photo-transistor or similar pickup device, which can be attached to the face of the meter housing 22.

As illustrated by Block 90, the meter under test is then calibrated based on one or more of the calibration parameters. Referring again to FIGS. 1–3, a single-turn full-load adjustable resistor 21, having a maximum range of approximately 3%, and a power factor adjust switch 22, such as a 16-position binary-coded switch, can be used to perform full-load (gain) and power factor adjustments.

After the meter has been calibrated at the factory, Block 90, it is shipped to the utility customer. As illustrated by Blocks 92–98, the utility may perform a pre-installation test of the meter to verify its accuracy prior to installation in the field and then calibrate the meter again, if necessary. The pre-installation calibration parameters derived therefrom can also be stored in the field calibration memory 44b so that a chronological history of the accuracy of the meter can be maintained by the meter. As illustrated by Blocks 100–102, the calibration parameters obtained from the pre-installation test can also be transferred to a utility database such as a mainframe computer. Statistical or similar analysis of the parameters can also be recorded in the utility database, Block 102.

As illustrated Blocks 104–114, the steps 92–102 can be periodically repeated during the life of the meter and the meter can be repeatedly updated to include a personal history of all the post-installation tests.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of recording calibration data in an electrical energy meter having non-volatile memory therein, comprising the steps of:

measuring the operational accuracy of the electrical energy meter at a first calendar date by:
testing the electrical energy meter with a first energy quantity to obtain a measurement of the first energy quantity which is unequal to the first energy quantity; and
generating a first calibration parameter based on a difference between the first energy quantity and the measurement of the first energy quantity;

storing the first calibration parameter and the first calendar date in the non-volatile memory of the electrical energy meter; then measuring the operational accuracy of the electrical energy meter at a second calendar date, subsequent to the first calendar date, by:
testing the electrical energy meter with a second energy quantity to obtain a measurement of the second energy quantity which is unequal to the second energy quantity; and
generating a second calibration parameter based on a difference between the second energy quantity and the measurement of the second energy quantity;
storing the second calibration parameter and the second calendar date in the non-volatile memory of the electrical energy meter;

reading the stored first calibration parameter, the stored first calendar date, the stored second calibration parameter and the stored second calibration date from the non-volatile memory on a third calendar date, subsequent to the first and second calendar dates; and determining a difference between the read first calibration parameter and the read second calibration parameter.

2. The method of claim 1 further comprising the steps of determining a difference in time between the read first calendar date and the read second calendar date.

3. The method of claim 2 wherein the meter includes an alphanumeric display and wherein said determining step comprises the step of displaying the difference on the alphanumeric display.

4. The method of claim 1 wherein said step of determining a difference between the read first calibration parameter and the read second calibration parameter is preceded by the step of:

transferring the read first calibration parameter and the read second calibration parameter to a second memory external to the meter.

5. The method of claim 1 further comprising the steps of:

calibrating the electrical energy meter on the first calendar date, based on the first calibration parameter; and calibrating the electrical energy meter on the second calendar date, based on the second calibration parameter.

6. The method of claim 1 wherein said step of measuring the operational accuracy of the electrical energy meter at the first calendar date is preceded by the steps of:

testing the electrical energy meter prior to installation in the field with at least two unequal energy quantities to obtain respective measurements of the at least two unequal energy quantities and then generating at least two factory calibration parameters based on differences between respective ones of the at least two unequal energy quantities and the corresponding measurements of the at least two unequal energy quantities; and storing the at least two factory calibration parameters in the non-volatile memory.

7. A method of recording calibration data in an electrical energy meter having non-volatile memory therein, comprising the steps of:

testing the accuracy of the meter at a first calendar date, prior to field installation, by the meter measure a first predetermined energy quantity to obtain a first measurement and then determining a first calibration parameter based on a difference between the first predetermined energy quantity and the first measurement;

storing the first calibration parameter and the first calendar date in the non-volatile memory; then testing the accuracy of the meter at a second calendar date, after field installation, by having the meter measure a second predetermined energy quantity to obtain a second measurement and then determining a second calibration parameter based on a difference between the second predetermined energy quantity and the second measurement;

storing the second calibration parameter and the second calendar date in the non-volatile memory; and transferring the first and second calibration parameters and the first and second calendar dates from the non-volatile memory to a second memory external to the meter.

8. The method of claim 7 wherein the step of testing the accuracy of the meter at a first calendar date is preceded by the step of storing a meter serial number and customer identification data in the non-volatile memory.

9. The method of claim 7 wherein said transferring step is followed by the step of determining a difference between the first calibration parameter and the second calibration parameter.

10. An electrical energy metering system for recording a quantity of electrical energy supplied along a power line, from an electrical energy source to a load, comprising:

a meter housing;

means, in said housing and adapted for electrical connection to a power line extending between an electrical energy source and a load, for metering a quantity of electrical energy supplied by the electrical energy source and consumed by the load;

register means, in the housing and electrically connected to said metering means, for recording the metered quantity of electrical energy supplied by the electrical energy source and consumed by the load;

non-volatile factory calibration memory, in said register means, for retaining a factory calibration date and at least one factory-installed calibration parameter which reflects an error in the measurement of electrical energy by said metering means on the factory calibration date, prior to installation in the field;

non-volatile field calibration memory, in said register means, for retaining a first field calibration date and a first field-programmed calibration parameter which reflects a first error in the measurement of electrical energy by said metering means on the first field calibration date, subsequent to installation in the field and for retaining a second field calibration date, which is unequal to the first field calibration date, and a second field-programmed calibration parameter which reflects a second error in the measurement of electrical energy by said metering means on the second field calibration date;

means, responsive to user actuation, for programming a first portion of said field calibration memory with the first field-programmed calibration parameter and for programming a second portion of said field calibration memory with the second field-programmed calibration parameter; and display means, electrically connected to said register means, for displaying the quantity of electrical energy consumed by the load.

11. The metering system of claim 10 further comprising a communications port at a face of said housing; and means, in said housing and operatively connected between said register means and said port, for interfacing said programming means to said register means by allowing a transfer of the first and second field-programmed calibration parameters from said programming means to said register means.

12. The metering system of claim 11 wherein said programming means comprises a portable computer and wherein said interfacing means comprises a serial data link.

13. The metering system of claim 10 wherein said programming means comprises means, in said housing and responsive to user actuation at a face thereof, for programming a first portion of said field calibration memory with the first field-programmed calibration parameter and for programming a second portion of said field calibration memory with the second field-programmed calibration parameter.

14. The metering system of claim 13 wherein said register means comprises an application specific integrated circuit.

15. The metering system of claim 14, wherein said programming means comprises a keypad in said housing, electrically connected to said application specific integrated circuit.

16. The metering system of claim 10, wherein said factory calibration memory contains a meter serial number and manufacture date.

17. An electrical energy meter, comprising:

means, electrically connectable to a power line extending between an electrical energy source and a load, for metering a quantity of electrical energy supplied by the electrical energy source and consumed by the load;

register means, electrically connected to said metering means, for recording the metered quantity;

display means, electrically connected to said register means, for displaying the metered quantity;

non-volatile factory calibration memory, in said register means, said non-volatile factory calibration memory containing a factory calibration date and at least one factory-installed calibration parameter which reflects an error in the measurement of electrical energy by said metering means on the factory calibration date, prior to installation in the field; and non-volatile field calibration memory, in said register means, said non-volatile factory calibration memory containing a first field calibration date, a first field-programmed calibration parameter which reflects an error in the measurement of electrical energy by said metering means on the first field calibration date, subsequent to installation in the field, a second field calibration date, which is unequal to the first field calibration date, and a second field-programmed calibration parameter which reflects an error in the measurement of electrical energy by said metering means on the second field calibration date.

* * * * *